United States Patent
Harada et al.

(10) Patent No.: US 6,730,976 B2
(45) Date of Patent: *May 4, 2004

(54) MULTILAYER GATE ELECTRODE STRUCTURE WITH TILTED ON IMPLANTATION

(75) Inventors: Akihiko Harada, Tokyo (JP); Motoshige Igarashi, Tokyo (JP)

(73) Assignee: Renesas Technology Corp., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/215,926

(22) Filed: Dec. 18, 1998

(65) Prior Publication Data

US 2001/0003378 A1 Jun. 14, 2001

(30) Foreign Application Priority Data

Jul. 10, 1998 (JP) .......................................... 10-195762

(51) Int. Cl.⁷ .......................... H01L 29/76; H01L 29/94
(52) U.S. Cl. ........................ 257/408; 257/336; 257/344
(58) Field of Search ................................ 257/336, 344, 257/387, 408, 900, 754, 755, 756; 438/302, 306, 217, 194, 647, 657

(56) References Cited

U.S. PATENT DOCUMENTS

| 5,276,347 A | | 1/1994 | Wei et al. ................... 257/388 |
| 5,355,006 A | * | 10/1994 | Iguchi ........................ 257/296 |
| 5,773,347 A | * | 6/1998 | Kimura et al. .............. 438/302 |

FOREIGN PATENT DOCUMENTS

| JP | 1-14968 | | 1/1989 |
| JP | 2-292833 | * | 12/1990 |
| JP | 2-298074 | | 12/1990 |
| JP | 3-3365 | | 1/1991 |
| JP | 3-218639 | | 9/1991 |
| JP | 4-11633 | | 4/1992 |
| JP | 5-267655 | | 10/1993 |

* cited by examiner

*Primary Examiner*—Hung Vu
(74) *Attorney, Agent, or Firm*—McDermott, Will & Emery

(57) ABSTRACT

A transistor which has a stable characteristic and which can prevent tilted ions from penetrating through a grain boundary to a channel region when ions are implanted at an angle so as to form impurity layers while a gate electrode is used as a mask. A gate electrode comprises a two-layer structure of a lower film and an upper film formed on a gate insulation film on the surface of a semiconductor substrate. The thickness of the lower film is made greater than the range of ions in the thickness wise direction in the film when the ions are implanted to the sidewalls of the lower film.

5 Claims, 8 Drawing Sheets

9a - 9c : tilted ions

9a - 9c : tilted ions

10: side spacers

17b:crystal grains in a lower film

19:vertical ions

9a - 9c : tilted ions

10:impurity

MULTILAYER GATE ELECTRODE STRUCTURE WITH TILTED ON IMPLANTATION

BACKGROUND OF THE INVENTION

1. Field of the Invention

The present invention relates to a structure of a gate electrode of a MOS transistor or the like and a method of manufacturing the gate electrode.

2. Description of Related Art

As a material for a gate electrode of a MOS transistor, polycrystalline silicon has been generally used. However, when the gate electrode is used as a mask to implanted ions in order to produce an impurity-diffused layer, it has a problem in that the implanted ions penetrate through the gate electrode, i.e., a grain boundary in the polycrystalline silicon, and arrive at. a channel region of the transistor, thereby impairing the desired characteristics of the transistor.

Various methods have been proposed to solve the above problem.

FIG. 9 is a cross-sectional view showing the structure of a MOS transistor described, e.g., in Japanese Patent Application Laid-open No. 2-298074. In the drawing, reference numeral 1 designates a semiconductor substrate; 2 designates a gate oxide film; 3 designates a first polycrystalline silicon or polysilicon film; 4 designates a second polycrystalline silicon film; 5 designates a gate electrode; 6 designates a source region; 7 designates a drain region; and 8 designates a channel region.

As shown in FIG. 9, the gate electrode 5 of the MOS transistor has a multilayer film structure comprising the first polycrystalline silicon film 3 and the second polycrystalline silicon film 4, which differ from each other in the size of their crystal grains diameter. Consequently, even when ions are implanted to the semiconductor substrate in order to produce source/drain regions 6 and 7 while the gate electrode 5 is used as a mask, from the view point of the implanted ions the multilayer structure causes the grain-boundary density of the gate electrode to appear to increase. Consequently, penetration of the ions through the grain boundary within the gate electrode is retarded, thereby preventing the ions from arriving at the channel region 8.

In such a structure of the conventional gate electrode, the thickness of each layer of the multilayer structure, particularly, the thickness and crystal grain diameter of the first polycrystalline silicon film 3 serving as a lower film, is not controlled accurately. Accordingly, for example, in a case where ions are implanted at a large angle in relation to the surface of the substrate to form a shallow impurity diffused layer in a gate overlap LDD structure while the gate electrode is used as a mask, as shown in FIG. 10, there exist ions 9a which are directly implanted to the sidewall of the first polycrystalline silicon film 3. The ions have a chance of penetrating through the grain boundary in the polycrystalline silicon film 3 and arriving at the channel region. The ions that arrived at the channel region form an impurity 10 in the channel region. When the potential of the gate electrode is turned off, the impurity 10 acts as a path for an electric current flowing from the source region to the drain region, thereby causing an off leakage current. The off leakage current results in, for example, deletion of the information stored in memory cells or an increase in power consumption, and it considerably impairs the characteristic of the transistor.

SUMMARY OF THE INVENTION

The present invention has been conceived to solve the problem set forth, and a first object of the present invention is to produce a semiconductor device having a gate electrode of multilayer structure which prevents penetration of ions (hereinafter referred to as "tilted ions") traveling through a grain boundary to a channel region even at the time of the tilted ion implantation at a large angle with respect to the substrate.

A second object of the present invention is to provide a semiconductor device having a gate electrode of multilayer structure which prevents penetration of tilted ions through a grain boundary to a channel region as a result of tilted ion implantation and which has a lower resistance.

A third object of the present invention is to provide a method of manufacturing a semiconductor device having a multilayer structure which prevents penetration of tilted ions through a grain boundary to a channel region even at the time of tilted ion implantation at a large angle.

A fourth object of the present invention is to provide a method of manufacturing a semiconductor device having a gate electrode of multilayer structure which prevents penetration of tilted ions through a grain boundary to a channel region as a result of tilted ion implantation and which has a lower resistance.

According to a first aspect of the present invention, there is provided a semiconductor device having a gate electrode of multilayer structure comprising a semiconductor substrate; a gate electrode made of multilayer film formed on the surface of the semiconductor substrate by way of a gate insulating film; and a pair of impurity diffused layers which are formed on the surface of the semiconductor substrate by means of tilted ion implantation while the gate electrode is used as a mask, wherein the thickness of the lowest film of the multilayer film is greater than the range of ions in a thicknesswise direction in the lowest film when the ions are implanted to sidewalls of the multilayer film by means of the tilted ion implantation.

In the semiconductor device, the gate electrode may have a two-layer film structure comprising a lower film formed from an amorphous silicon film and an upper film formed from a polycrystalline silicon film.

In the semiconductor device, the gate electrode may have a two-layer film structure comprising a lower film and an upper film, and the upper film comprises a first upper film and a second upper film provided so as to surround the sidewalls of the first upper film.

According to a second aspect of the present invention, a method of manufacturing a semiconductor device having a gate electrode of multilayer structure comprising the steps of forming a gate electrode from a multilayer film on the surface of a semiconductor substrate by way of a gate insulting film; forming a pair of impurity diffused layers on the semiconductor substrate by tilted ion implantation while the gate electrode is used as a mask; and forming the lowest film of the multilayer film in such a way that a thickness of the lowest film is greater than the range of ions in a thicknesswise direction in the lowest film when the ions are implanted to the sidewalls of the lowest film by means of the tilted ion implantation.

In the method of manufacturing a semiconductor device having a gate electrode of multilayer structure, the step of forming a gate electrode may comprise the steps of forming a lower film from an amorphous silicon film on the semiconductor substrate and forming an upper film from a polycrystalline silicon film on the lower film.

In the method of manufacturing a semiconductor device having a gate electrode of multilayer structure, wherein the lower film formed from an amorphous silicon film may be formed by ion implantation of oxygen or silicon to the polycrystalline silicon film.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1:
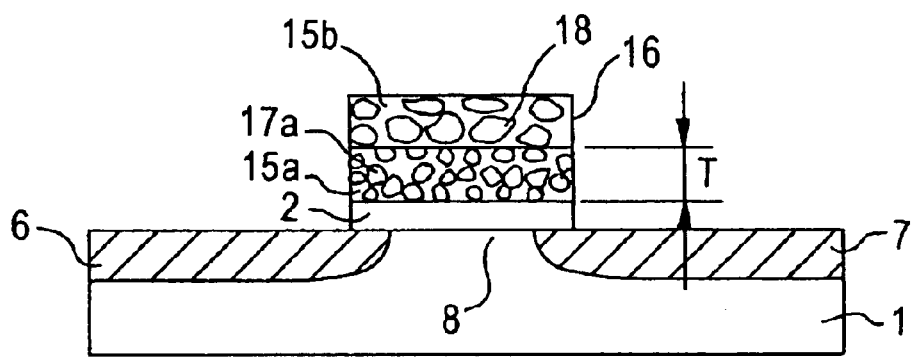
FIG. 1 is a cross-sectional view showing the structure of a MOS transistor having a gate overlap LDD structure according to embodiment 1, at a stage of manufacture immediately after formation of shallow source and drain regions.

Embodiments of the present invention will be described below with reference to the accompanying drawings. It is noted that the same reference symbols in the drawings denote the same or corresponding components.

Embodiment 1

FIG. 1 is a cross-sectional view showing the structure of a MOS transistor having a gate overlap LDD structure comprising a gate electrode of two-layer structure according to embodiment 1, at a stage of immediately after formation of shallow source and drain regions.

In the drawing, reference numeral 1 designates a semiconductor substrate; 2 designates a gate oxide film; 6 designates a shallow source region; 7 designates a shallow drain region; 8 designates a channel region; 15a designates an amorphous silicon film; 15b designates a polycrystalline silicon film; 17a designates a crystal grain of the amorphous silicon film 15a; and 18 designates a crystal grain of the polycrystalline silicon film 15b.

The gate electrode of the MOS transistor has, on the gate oxide film 2, a two-layer film structure comprising an amorphous silicon film 15a as a lower film and a polycrystalline silicon film 15b as an upper film. The thickness of the amorphous silicon film 15a denoted by T in the drawing is set so as to become greater than the range of ions within the film when the tilted ions are implanted to the sidewall of the amorphous silicon film 15a in order to form the source and drain regions 6 and 7 while the gate electrode is used as a mask.

As shown in FIG. 1, in the gate electrode according to embodiment 1, the thickness of the amorphous silicon film 15a denoted by T in the drawing is set so as to become greater than the range of ions in the thicknesswise direction within the amorphous silicon film 15a when the tilted ions are implanted to the sidewall of the amorphous silicon film 15a at a large angle in order to form the shallow source and drain regions 6 and 7 while the gate electrode is used as a mask. Consequently, the tilted ions can be prevented from penetrating through the grain boundary to the channel region 8. Here, the term "range" represents a mean distance over which ions travel in the film, and the distribution of consecutively-implanted ions assumes a substantially Gaussian distribution centered on the range. A crystal grain size of the polycrystalline silicon film 15b is desirably increased as much as possible compared with that of the amorphous silicon film 15a to reduce the resistance of the gate electrode.

The reason for this will now be described hereinbelow in more detail.

Figure 2:
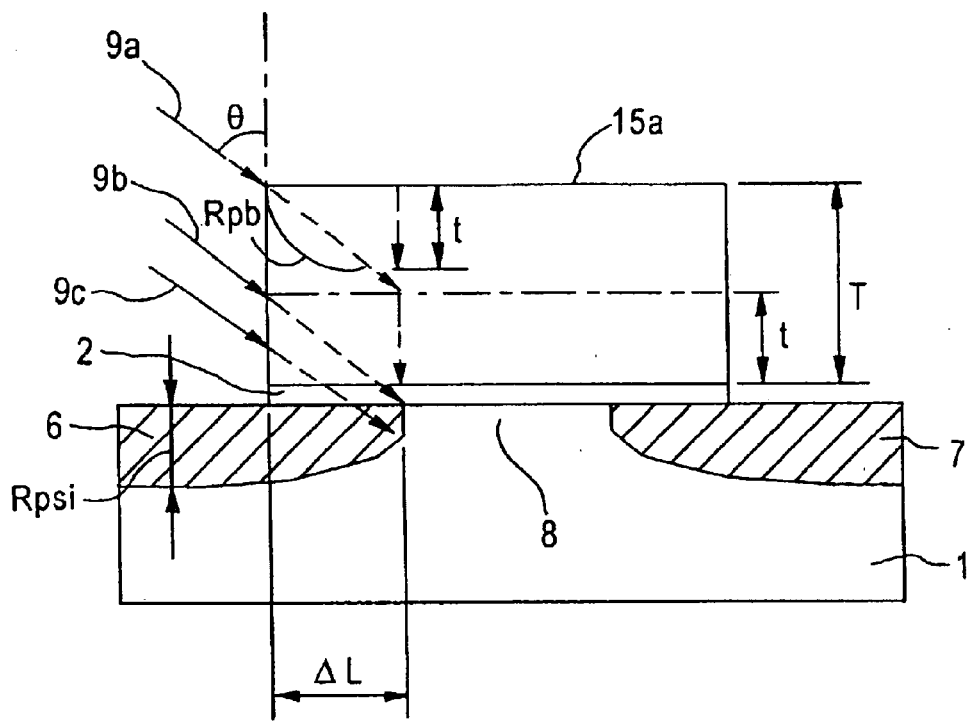
FIG. 2 is an enlarged cross-sectional view showing the structure of a MOS transistor having a gate overlap LDD structure according to embodiment 1.

FIG. 2 is an enlarged cross-sectional view conceptually showing the range of tilted ions in the amorphous silicon film 15a when ions are implanted to the sidewalls of the lower amorphous silicon film 15a at a large angle in order to form shallow source/drain regions while the gate electrode 16 shown in FIG. 1 is used as a mask.

In FIG. 2, reference numerals 9a to 9c designate tilted ions which are consecutively implanted to respective positions on the sidewall of the amorphous silicon film 15a.

In FIG. 2, tilted ions are implanted at an angle at a predetermined energy which determines a predetermined large angle θ with respect to a line perpendicular to the surface of the semiconductor substrate 1 and the depth $R_{psi}$ of the shallow source and drain regions 6 and 7. Of these tilted ions, the ions 9a to 9c implanted to the sidewall of the amorphous silicon film 15a penetrate through the grain boundary in the film in the direction denoted by dashed arrows. The ions come to a stop after having traveled over only a certain range corresponding to the quality (i.e., the crystal grain size) of the film to which the ions travel. Of these ions, the ion 9c, which has stopped in the semiconductor substrate 1, forms an impurity diffused layer in an overlap portion between the semiconductor substrate and the gate electrode 16. The ion 9b, which has stopped precisely at the surface of the semiconductor substrate 1, determines the length ΔL of the overlap.

More specifically, so long as the thickness T of the amorphous silicon film 15a is set so as to become greater than at least thickness "t" in FIG. 2 corresponding to a component in the thicknesswise direction of the range $R_{Pb}$ in the amorphous silicon film 15a, there is prevented an unwanted impurity, which would otherwise be created by penetration of the tilted ions through the grain boundary to the channel region 8. The reason for this is that an ion, such as ion 9a, entering a position higher than the top line denoting the thickness "t" in FIG. 2 travels over only the range $R_{Pb}$ within the amorphous silicon film 15a and comes to a stop in the amorphous silicon film 15a. Therefore, the ion 9a does not arrive at the channel region 8. In contrast, the ion 9c entering a position lower than the lower line denoting the thickness "t" in FIG. 2 only forms an impurity diffused layer in the overlap in the manner as mentioned previously.

The length $\Delta L$ of the overlap can be set to an arbitrary value required to ensure a desired characteristic for a transistor of desired size, by controlling the angle θ of ion implantation and the granular size of crystal of the amorphous silicon film 15a. For instance, to reduce the length $\Delta L$ of the overlap, so long as the granular size of crystal of the amorphous silicon film 15a is reduced, the range $R_{Pb}$ of the ion 9b which is implanted to the sidewall of the amorphous silicon film 15a and determines the length $\Delta L$ of the overlap is reduced. Consequently, the length $\Delta L$ is also reduced. At this time, the minimum required thickness "t" of the amorphous silicon film 15a is also reduced correspondingly. Alternatively, so long as the implantation angle θ is reduced, the length $\Delta L$ can be reduced similarly. However, at this time, the minimum required thickness "t" of the amorphous silicon film 15a becomes large.

Next, it is explained that a side spacer is further formed on each side of the gate electrode, and deep source and drain regions of a gate overlap LDD structure are formed while the gate electrode and the side spacers are used as masks.

Figure 3:
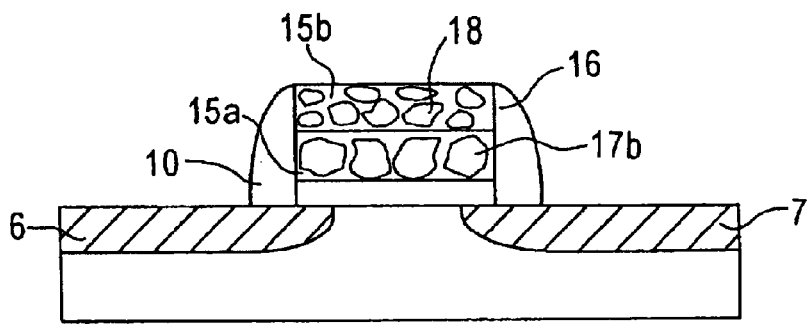
FIG. 3 is a cross-sectional view showing the structure of a MOS transistor having a gate overlap LDD structure according to embodiment 1 immediately after formation of a side spacer.

FIG. 3 is a cross-sectional view showing the structure of a MOS transistor having a gate overlap LDD structure immediately after formation of a side spacer on either side of the gate electrode.

Figure 4:
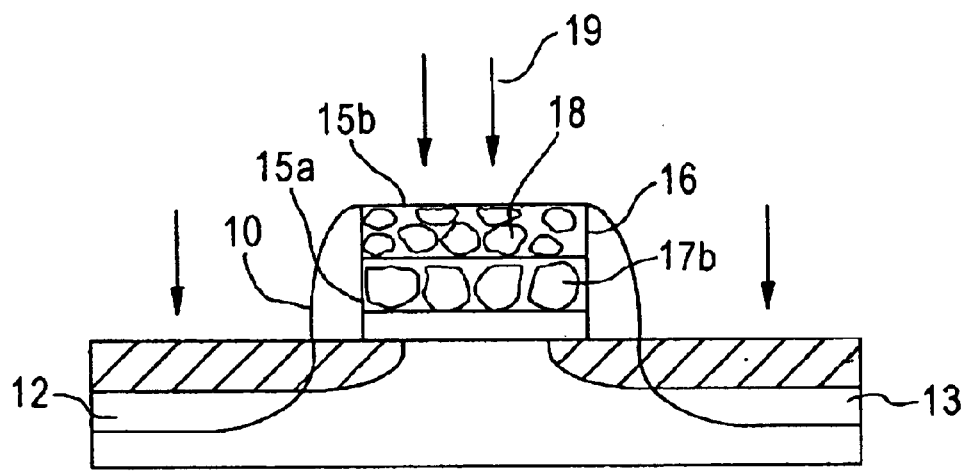
FIG. 4 is a cross-sectional view showing the structure of a MOS transistor having a gate overlap LDD structure according to embodiment 1, in which deep source and drain regions are formed.

FIG. 4 is a cross-sectional view showing the structure of a MOS transistor having a gate overlap LDD structure, in which deep source and drain regions are formed by ion implantation while the gate electrode and its side spacers are used as masks.

In both drawings, reference numeral 10 designates a side spacer; and 19 designates an ion traveling perpendicular to the semiconductor substrate 1 (hereinafter called a "vertical ion") during ion implantation. The reference numerals which are the same as those used in FIG. 1 or 2 designate identical or corresponding elements.

In FIG. 3, on both sidewalls of the gate electrode 16 of two-layer film structure shown in FIG. 1, the side spacers 10 are formed from, e.g., silicon oxide. Then, because of the high-temperature heat treatment required to form the side spacers, the amorphous silicon film 15a becomes re-crystallized so that the crystal grains of the amorphous silicon film are overgrown to crystal grains 17b. In contrast, crystal grains 18 of the polycrystalline silicon film 15b are not affected by the heat treatment and remain unchanged.

The inventors of the present invention found that the phenomenon—in which only grains of an amorphous silicon film of such a multilayer film structure comprising a polycrystalline silicon film and an amorphous silicon film become overgrown during heat treatment—is unique to a combination of the polycrystalline silicon film and the amorphous silicon film. As will be described later, utilization of such a phenomenon results in a reduction in the resistance of the gate electrode.

Next, in FIG. 4, the gate electrode 16 and its side spacers 10 are used as masks to form deep source and drain regions 12 and 13 by ion implantation.

At this time, the crystal grains of the amorphous silicon film 15 become overgrown, thereby drastically deteriorating the prevention of penetration of implanted ions 19 through a grain boundary. However, by utilization of the unchanging property of the crystal grains 18 of the polycrystalline silicon film 15, the crystal grains 18 are desirably grown beforehand to such a size as to prevent the implanted ions 19 from penetrating through the amorphous silicon film and the polycrystalline silicon film and to prevent the same from arriving at the channel region. At this time, the overgrowth of the crystal grains of the amorphous silicon film 15a simultaneously results in a reduction in the resistance of the gate electrode and an improvement in the response characteristic of the transistor.

Next, a method of manufacturing the MOS transistor having the gate overlap LDD structure will be explained in detail.

FIGS. 5A to 5E are cross-sectional views showing the process of manufacturing the MOS transistor having the gate overlap LDD structure according to the embodiment 1.

Figure 5A:
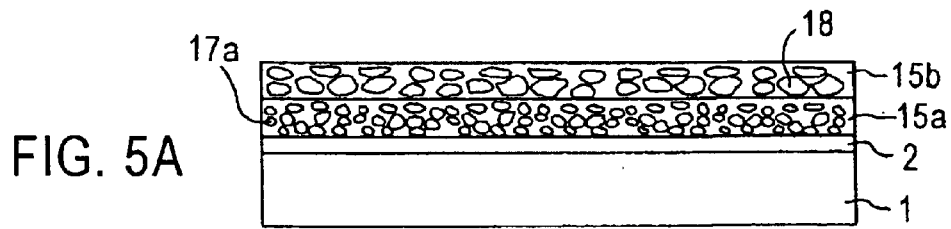
FIGS. 5A to 5E are cross-sectional views showing the process of manufacturing a MOS transistor having a gate overlap LDD structure according to embodiment 1.

As seen in FIG. 5A, the gate insulating film 2 is formed on the semiconductor substrate 1 to a thickness of 5 to 6 nm, and by means of CVD at about 500° C. an amorphous silicon film is formed as a lower film 15a on the gate insulating film 2 to a thickness of 40 to 50 nm. Subsequently, by means of CVD at 550 to 600° C. a polycrystalline silicon film is formed on the amorphous silicon film as an upper film 15b to a thickness of 200 to 300 nm. The grain diameters of the amorphous silicon film and the polycrystalline silicon film are controlled by introduction of impurities, such as phosphorous or boron, to the substrate at a dose of $4 \times 10^{20}$ cm$^{-2}$ to $6 \times 10^{20}$ cm$^{-2}$.

The thickness of the lower film 15a is set so as to become greater than the range of tilted ions in the thicknesswise direction within the lower film at the time of tilted ion implantation, as will be described later. The grain diameter of the lower film is controlled so as to be able to obtain a desired overlap length $\Delta L$. Further, the grain diameter of the upper film 15b is controlled to as great diameter as possible in order to reduce the resistance of the gate electrode. However, the grain diameter is controlled so as to become small enough to prevent penetration to the channel region of the ions at a stage of forming deep source and drain regions as will be described later.

Figure 5B:
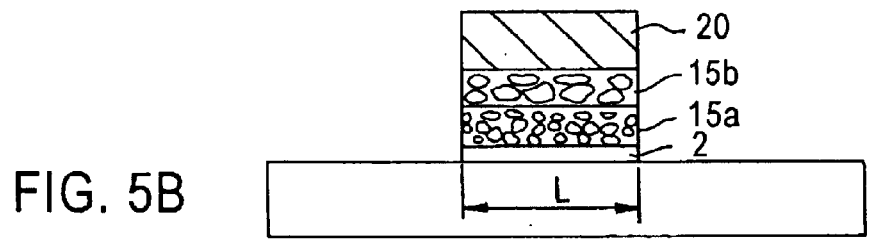

Next, referring to FIG. 5B, a desired resist pattern 20 is formed to be used as a mask. Then, the gate insulating film 2 formed from a silicon oxide, the amorphous silicon film 15a serving as a lower film, and the polycrystalline silicon film 15b serving as an upper film are etched so that there is formed a gate electrode 15 of two-layer film structure having a gate length L of, e.g., 0.25 μm.

Figure 5C:
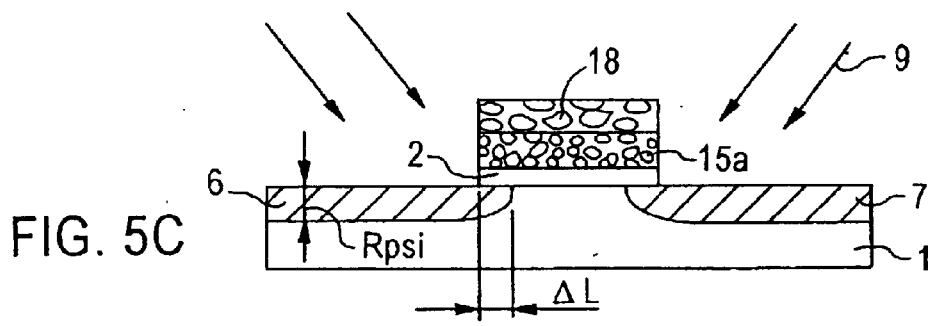

Next, referring to FIG. 5C, boron ions are implanted to the semiconductor substrate at an angle of 45° with respect to the surface of the substrate, at an energy of 15 to 25 KeV, and at a dose of $0.8 \times 10^{13}$ cm$^{-2}$ to $1.5 \times 10^{13}$ cm$^{-2}$ while the gate electrode 16 is used as a mask, thereby forming the shallow source and drain regions 6 and 7 having a desired depth $R_{PSi}$ and a desired overlap length $\Delta L$. In a case where ions are implanted under the conditions, i.e., the thickness and crystal grain diameter of the amorphous silicon film 15a mentioned above, the length $\Delta L$ of the overlap assumes a value of about 0.03 μm.

Figure 5D:
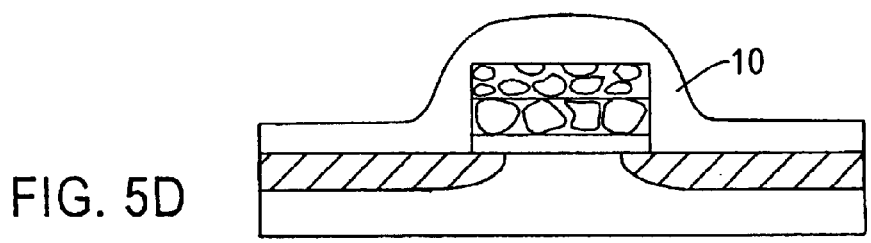

Next, referring to FIG. 5D, the-silicon oxide film 10 is formed to a thickness of 80 to 100 nm over the entire surface of the semiconductor substrate 1 so as to cover the gate electrode 16. Subsequently, the silicon oxide film 10 is etched back, so that the silicon oxide film is left solely on both sidewalls of the gate electrode 16. As a result, the side spacers 10 are formed.

Figure 5E:
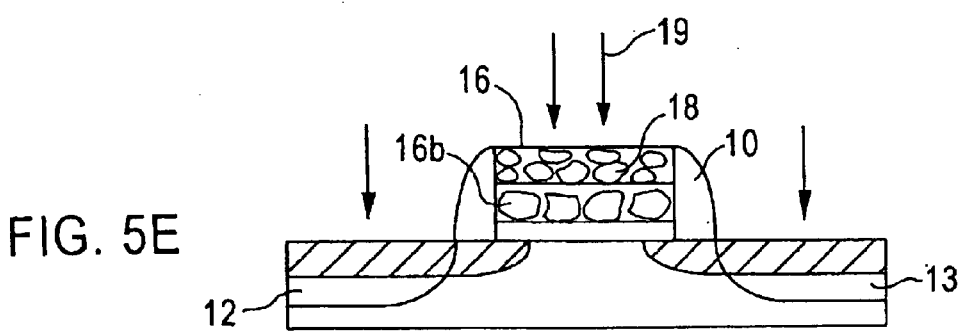

Next, referring to FIG. 5E, the deep source and drain regions 12 and 13 are formed by implanting phosphorous ions to the semiconductor substrate 1 at an angle of 7° with respect to the surface of the substrate 1, at an energy of 30 to 40 KeV, and at a dose of $1 \times 10^{13}$ cm$^{-2}$ to $4-10^{13}$ cm$^{-2}$ while the gate electrode 16 and the side spacers 10 are used as masks. As a result, there is completed a MOS transistor having a gate overlap LDD structure.

Although in embodiment 1 the polycrystalline silicon film 15b is used as the upper film, a high-melting-point metal film or silicide film may be used. In such a case, the present invention yields the advantage of being able to reduce the resistance of the gate electrode to a much greater extent.

Further, although in embodiment 1 a gate electrode of two-layer film structure is used, a gate electrode having a multilayer film structure of three layers or more may also be used. In this case also, there can be obtained an advantageous result similar to that yielded in the embodiment.

Embodiment 2

Figure 6:
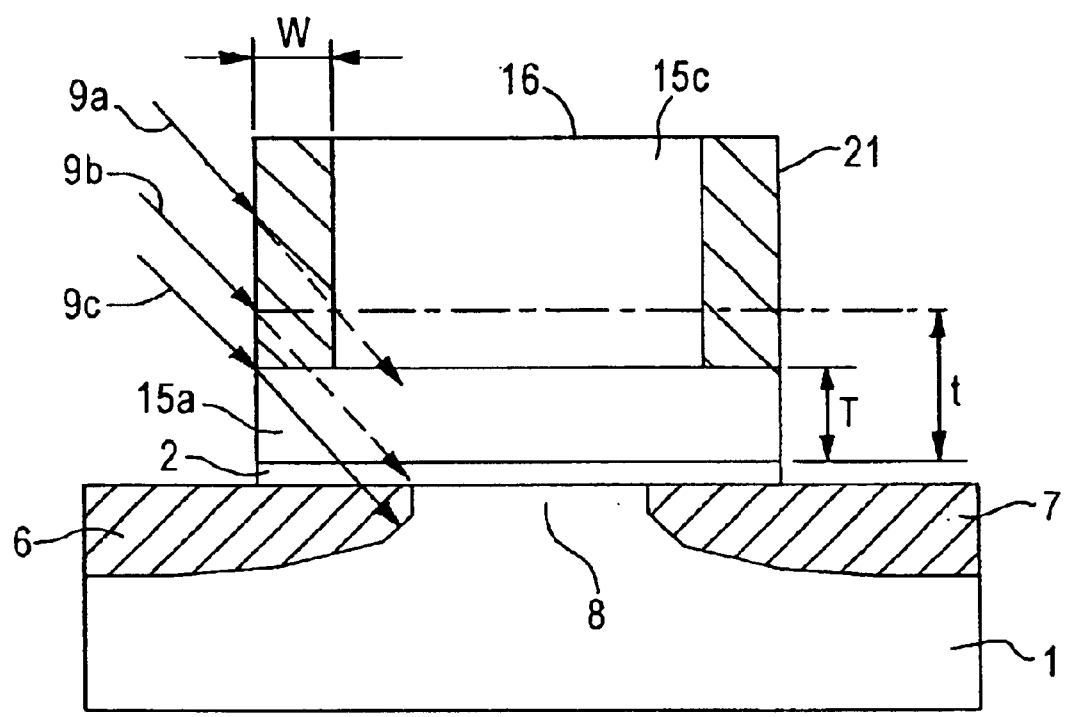
FIG. 6 is a cross-sectional view showing the structure of a MOS transistor having a gate overlap LDD structure according to embodiment 2, in which shallow source and drain regions are formed.

FIG. 6 is an enlarged cross-sectional view conceptually showing the range of tilted ions in films of a gate electrode when ions are implanted to the sidewalls of the gate electrode at a large angle while the gate electrode is used as a mask in order to form shallow source/drain regions in a MOS transistor of gate overlap LDD structure having a gate electrode of two-layer film structure according to embodiment 2.

In FIG. 6, reference numerals 9a to 9c designate tilted ions entering positions on the sidewalls of the amorphous silicon film 15a; 15c designates a metal film having a high fusing point, such as a tungsten film; and 21 designates a silicon oxide film having crystal grain whose diameter is equal to or smaller than the amorphous silicon film 15a. The reference numerals which are the same as those used in FIG. 2 designate identical or corresponding elements.

In FIG. 6, in the gate electrode according to embodiment 2, the polycrystalline silicon film 15b as an upper film of the gate electrode shown in FIG. 1 according to embodiment 1 comprises a tungsten film 15c which is formed from metal having a high fusing point and serves as a first upper film, and a silicon oxide film 21 which surrounds sidewalls of the tungsten film and has grain whose diameter is equal to or smaller than the amorphous silicon film 15a and serves as a second upper film.

In such a gate electrode structure, even if the thickness T of the amorphous silicon film 15a becomes smaller than the minimum required thickness "t" which, as mentioned in the description of embodiment 1, serves to prevent tilted ions from penetrating from the sidewalls of the amorphous silicon film 15a through a grain boundary to the channel region 8, the silicon oxide film 21 prevents penetration through the grain boundary of the ions 9a and 9b implanted to at positions higher than the upper line denoting the thickness T. Accordingly, tilted ions are prevented from penetrating through the grain boundary to the channel region 8. The width of the silicon oxide film 21 indicated by "W" in FIG. 6 and the grain diameter in the film may be determined in consideration of variations in the thickness of the amorphous silicon film 15a during the process of manufacturing the film.

The first upper film is not limited to a silicon oxide film; any film, such as a nitride film, may be used as the first upper film so long as the film has a grain diameter equal to or smaller than that of the lower film.

Further, a polycrystalline silicon film or a silicide film, for example, may be used as the upper film instead of the metal film having a high fusing point. In order to reduce the resistance of the gate electrode, the grain diameter of the upper film should desirably assume as large a value as possible. Further, the grain diameter of the upper film is desirably reduced beforehand to an extent sufficient to prevent implanted ions from arriving at the channel region when the deep source and drain regions are formed while the gate electrode is used as a mask.

A method of manufacturing the MOS transistor shown in FIG. 6 will now be described by reference to FIGS. 7A to 7F. In the drawings, the reference numerals which are the same as those used in FIG. 6 designate identical or corresponding elements.

Figure 7A:
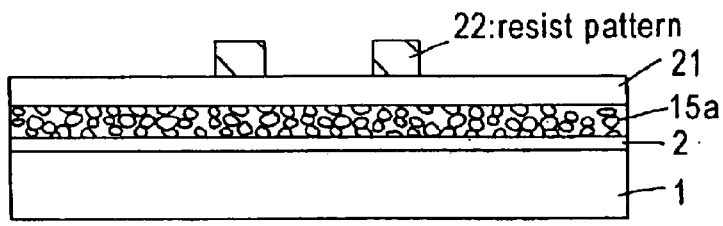
FIGS. 7A to 7F are cross-sectional views showing the process of manufacturing a MOS transistor having a gate overlap LDD structure according to embodiment 2.

First, as seen in FIG. 7A, as a gate oxide film, a silicon oxide film 2 is formed on the semiconductor substrate 1 to a thickness of 5 to 6 nm. By means of CVD at 550 to 600° C., an amorphous silicon film is formed as a lower film 15a to a thickness of 40 to 50 nm, and subsequently a silicon oxide film is formed as a second upper film 21 to a thickness of 200 to 300 nm, further a resist pattern 22 is formed on the film.

Figure 7B:
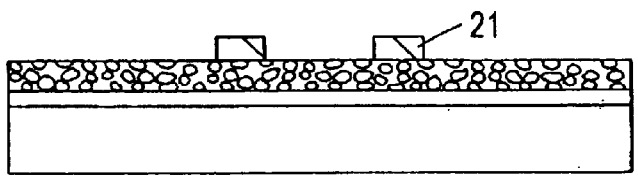

As seen in FIG. 7B, only the silicon oxide film 21 is anisotropically dry-etched while the resist pattern 22 is used as a mask, and subsequently the resist pattern 22 is removed.

Figure 7C:
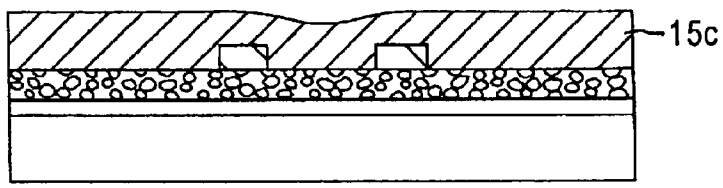

As seen in FIG. 7C, by means of, e.g., CVD, a tungsten film 15c is formed as a first upper film over the entire surface of the semiconductor substrate to a thickness of 400 to 500 nm so as to cover the silicon oxide film 21.

Figure 7D:
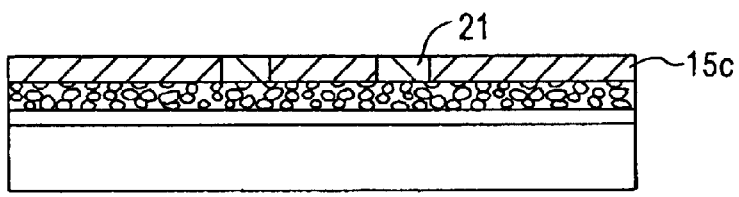

As seen in FIG. 7D, the tungsten film 15c is then anisotropically dry-etched or subjected to surface abrasion (by means of Chemical-and Mechanical polishing), thereby exposing the surface of the silicon oxide film 21. The tungsten film 15c and the silicon oxide film 21 are etched back until the surface of the tungsten film 15c including the surface of the silicon oxide film 21 becomes substantially smooth.

Figure 7E:
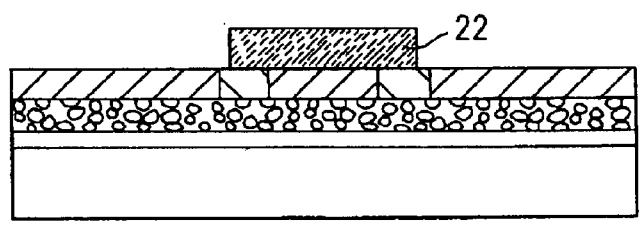

As seen in FIG. 7E, the resist pattern 22 is formed on the tungsten film 15c and the silicon oxide film 21.

Figure 7F:
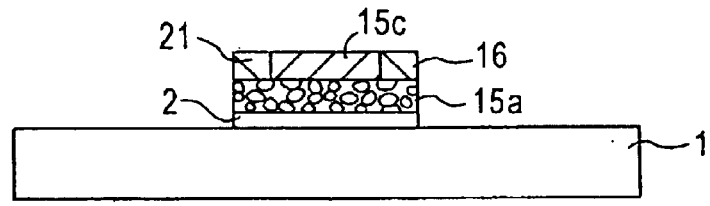

As seen in FIG. 7F, the tungsten film 15c, the silicon oxide film 21, and the amorphous silicon film 15a are anisotropically dry-etched while the resist pattern 22 is used as a mask. Subsequently, the resist pattern 22 is removed, thereby completing the gate electrode 16 of multilayer film structure.

According to the embodiment, when tilted ions are implanted while the gate electrode is used as a mask, even if the thickness of the amorphous silicon film is reduced, it is enable to prevent the tilted ions from penetrating through a boundary region to a channel region, thereby, stable transistor characteristics are attained.

Embodiment 3

Although in embodiment 1, during manufacture of the gate electrode of two-layer film structure, the amorphous silicon film 15a serving as a lower film and the polycrystalline silicon film 15b serving as an upper film are sequentially formed. In the embodiment 3, the multilayer film structure is formed by means of ion implantation.

Figure 8A:
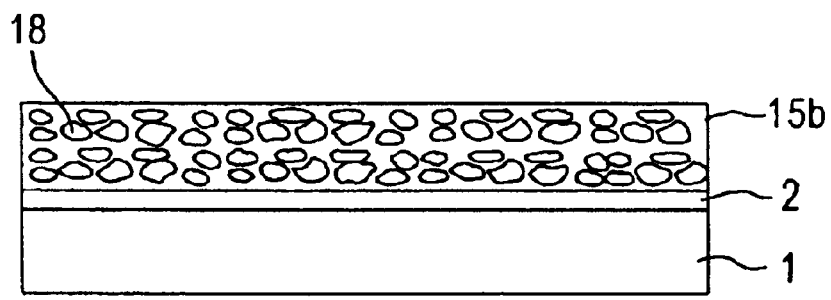
FIGS. 8A to 8C are cross-sectional views showing the process of a method of forming a gate electrode of two-layer film structure according to embodiment 3.
Figure 8B:
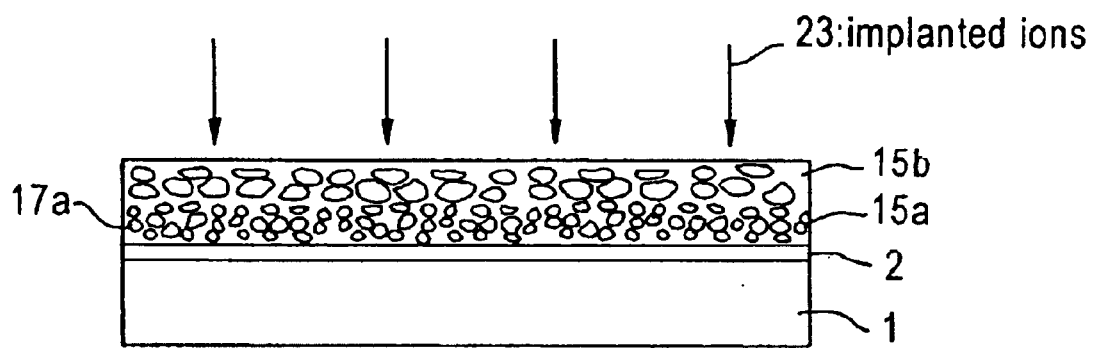
Figure 8C:
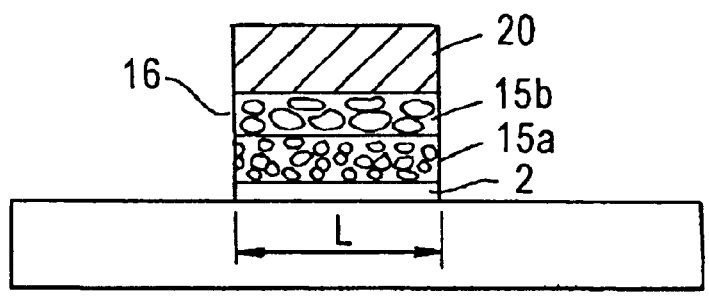
Figure 9:
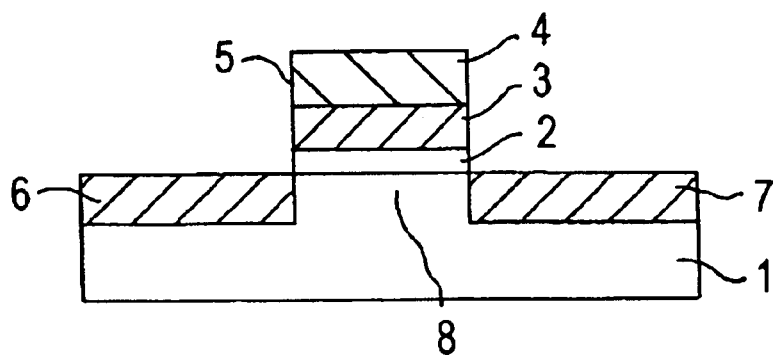
FIG. 9 is a cross-sectional view showing a structure of a conventional MOS transistor.
Figure 10:
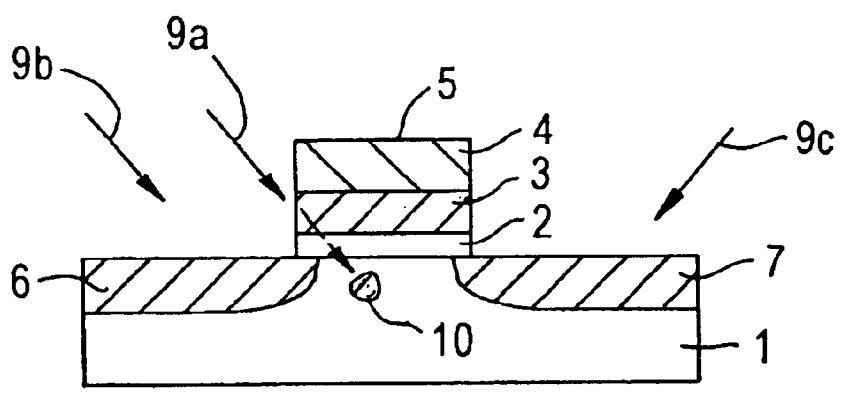
FIG. 10 is a cross-sectional view showing a structure of a conventional MOS transistor at the process of ion implantation.

FIGS. 8A to 8C are cross-sectional views showing a method of forming a gate electrode of two-layer film structure according to embodiment 3. In the drawing, reference numeral 23 designates an implanted ion, and the same reference numerals as those shown in FIG. 5 designate identical or corresponding elements.

First, as seen in FIG. 8A, the silicon oxide film 2 is formed on the semiconductor substrate 1 to a thickness of 5 to 6 nm as a gate insulating film, and by means of CVD at 550 to 600° C. the polycrystalline film 15b is formed on the gate insulating film 2 to a thickness of 250 to 350 nm. At this time, impurities, such as phosphorous or boron, are introduced to the polycrystalline silicon film 15b at a dose of $4\times10^{20}$ cm$^{-2}$ to $6\times10^{20}$ cm$^{-2}$, thereby controlling the grain diameter of the polycrystalline film 15b.

Next, as seen in FIG. 8B, silicon or oxygen ions 23 are implanted to the polycrystalline silicon film 15b, thereby rendering only a lower portion of the polycrystalline silicon film 15b amorphous. For example, in a case of implantation of silicon atoms, the atoms are implanted at an energy of 5 to 10 KeV at an angle of 7° with respect to the surface of the semiconductor substrate 1. The layer that has been made amorphous forms the amorphous silicon layer 15a serving as a lower film, and the amorphous silicon layer 15a constitutes a portion of the two-layer film structure together with the remaining portion of the polycrystalline silicon film 15b that is not made amorphous. As mentioned in the description of embodiment 1, the thickness and grain diameter of the amorphous silicon film 15a are controlled so as to assume desired values according to the type of ions 23 and the implantation energy, such that tilted ions are prevented from penetrating through a grain boundary to a channel region during tilted ion implantation.

As seen in FIG. 8C, the resist pattern 20 is formed on the polycrystalline silicon film 15b. The polycrystalline silicon film 15b, the amorphous silicon film 15a and the silicon oxide film 2 are etched while the resist pattern 20 is used as a mask. Subsequently, the resist pattern 20 is removed, thereby completing the gate electrode 16 of two-layer film structure.

In the steps subsequent to the foregoing step, a MOS transistor having a gate overlap LDD structure which prevents ions from penetrating through a grain boundary to a channel region is completed through processing steps similar to those shown in FIGS. 5A to 5E.

According to embodiment 3, the manufacturing processes can be simplified by a gate electrode of two-layer film structure being formed through ion implantation.

Since the present invention is configured as mentioned above, the present invention yields the following advantageous results.

Since the lowest film in the gate electrode of multilayer film structure has a thickness greater than the range of ions in the thicknesswise direction in the lowest film when the ions are implanted to the gate electrode. Accordingly, even when the semiconductor substrate is subjected to tilted ion implantation while the gate electrode is used as a mask, tilted ions can be prevented from penetrating through a grain boundary to a channel region, thereby resulting in a semiconductor device having stable characteristics.

Further, since the tilted ions can be prevented from penetrating through the grain boundary to the channel region, the electric resistance of the gate electrode can be reduced. Accordingly, there can be ensured the attainment of desirable transistor characteristics, such as fast response and high stability.

Since the upper film is formed from the first upper film and the second upper film provided so as have the sidewalls of the first upper film sandwiched therebetween, the thickness of the lower film is reduced even when the semiconductor substrate is subjected to tilted ion implantation while the gate electrode is used as a mask. Consequently, the tilted ions can be prevented from penetrating through the grain boundary to the channel region, thus resulting in a semiconductor device having high stability.

Further, since the lowest film of the gate electrode of multilayer film structure is formed so as to having a thickness greater than the range of ions in the thicknesswise direction in the lowest film when the ions are implanted to the sidewalls of the lowest film. Consequently, there can be provided a method of manufacturing a semiconductor device in which there is prevented deterioration of a transistor characteristic, which would otherwise be caused by penetration of ions to a channel region when the semiconductor substrate is subjected to tilted ion implantation while the gate electrode is used as a mask.

Since an amorphous silicon layer is formed as the lowest film and a polycrystalline film is formed on the lowest film, the resistance of the gate electrode can be reduced.

Since the gate electrode of multilayer film structure can be formed through ion implantation, the manufacturing processes of the semiconductor device can be simplified.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 10-195762 filed on Jul. 10, 1998 including specification, claims, drawings and summary are incorporated herein by reference in its entirety.

What is claimed is:

1. A semiconductor device having a gate electrode of multilayer structure, the device comprising:
   a semiconductor substrate;
   said gate electrode made of multilayer film formed on a surface of said semiconductor substrate by way of a gate insulating film; and
   a pair of impurity diffused layers, with a channel region therebetween, which impurity diffused layers are formed on the surface of said semiconductor substrate by means of tilted ion implantation while said gate electrode is used as a mask,
   wherein the thickness of a lower film of the multilayer film is greater than the penetration range therein of ions implanted by tilted ion implantation to form the impurity diffused layers, so that the ions implanted by tilted ion implantation do not penetrate through the lower film into the channel region.

2. The semiconductor device according to claim 1, wherein said gate electrode has a two-layer film structure comprising the lower film formed from an amorphous silicon film and an upper film formed from a polycrystalline silicon film.

3. The semiconductor device according to claim 1, wherein said gate electrode has a two-layer film structure comprising the lower film and an upper film, and the upper film comprises a first upper film and a second upper film provided so as to surround the sidewalls of the first upper film.

4. The semiconductor device according to claim 1, wherein said gate electrode has a lowest film comprising amorphous silicon.

5. A semiconductor device having a gate electrode of multilayer structure, the device comprising:
   a semiconductor substrate;
   said gate electrode made of multilayer film, comprising a lower recrystallized amorphous silicon film comprising grains having a first diameter and an upper polysilicon film comprising grains having a second diameter, formed on a surface of said semiconductor substrate by way of a gate insulating film; and
   a pair of impurity diffused layers, with a channel region therebetween, which impruity diffused layers are formed on the surface of said semiconductor substrate by means of tilted ion implantation while said gate electrode is used as a mask, said impurity diffused layers having an overlap portion with said gate electrode, wherein the second diameter is smaller than the first diameter, and wherein the second diameter is controlled so that the ions implanted by tilted ion implantation do not penetrate through the lower film into the channel region and so that a length of the overlap portion of said impurity diffused layers is a desired size.

* * * * *